United States Patent
Yin et al.

(10) Patent No.: US 10,730,740 B2
(45) Date of Patent: Aug. 4, 2020

(54) MICROELECTROMECHANICAL DISPLACEMENT STRUCTURE AND METHOD FOR CONTROLLING DISPLACEMENT

(71) Applicant: Agiltron, Inc., Woburn, MA (US)

(72) Inventors: Luzhong Yin, Woburn, MA (US); Jing Zhao, Woburn, MA (US)

(73) Assignee: Agiltron, Inc., Woburn, MA (US)

( * ) Notice: Subject to any disclaimer, the term of this patent is extended or adjusted under 35 U.S.C. 154(b) by 115 days.

(21) Appl. No.: 15/282,870

(22) Filed: Sep. 30, 2016

(65) Prior Publication Data
US 2017/0184840 A1 Jun. 29, 2017

Related U.S. Application Data

(63) Continuation of application No. 15/300,212, filed as application No. PCT/US2015/022117 on Mar. 24, (Continued)

(51) Int. Cl.
*B81B 3/00* (2006.01)
*G02B 26/04* (2006.01)
(Continued)

(52) U.S. Cl.
CPC .......... *B81B 3/0037* (2013.01); *B81B 3/0024* (2013.01); *G02B 26/02* (2013.01);
(Continued)

(58) Field of Classification Search
CPC ................ B81B 3/0037; B81B 3/0024; B81B 2203/0315; B81B 2201/045;
(Continued)

(56) References Cited

U.S. PATENT DOCUMENTS 4,771,016 A 9/1988 Bajor et al.
4,823,607 A 4/1989 Howe et al.
(Continued)

FOREIGN PATENT DOCUMENTS

CN 105278060 B 11/2017
EP 0469749 A1 2/1992
EP 1143467 A2 10/2001

OTHER PUBLICATIONS

Asheghi et al., Temperature-Dependent Thermal Conductivity of Single-Crystal Silicon Layers in SOI Substrates. Transactions of the ASME. Feb. 1998;120;30-36.
(Continued)

*Primary Examiner* — Cara E Rakowski
(74) *Attorney, Agent, or Firm* — McCarter & English, LLP (57) ABSTRACT

The present disclosure provides a displacement amplification structure and a method for controlling displacement. In one aspect, the displacement amplification structure of the present disclosure includes a first beam and a second beam substantially parallel to the first beam, an end of the first beam coupled to a fixture site, an end of the second beam coupled to a motion actuator, and a motion shutter coupled to an opposing end of the first and second beams. In response to a displacement of the motion actuator along an axis direction of the second beam, the motion shutter displaces a distance along a transversal direction substantially perpendicular to the axis direction.

43 Claims, 11 Drawing Sheets

Related U.S. Application Data 2015, which is a continuation of application No. 14/529,602, filed on Oct. 31, 2014, now Pat. No. 9,256,065, and a continuation-in-part of application No. 14/242,328, filed on Apr. 1, 2014, now abandoned.

(51) Int. Cl.
- *G02B 26/02* (2006.01)
- *H02N 2/04* (2006.01)
- *H02N 10/00* (2006.01)

(52) U.S. Cl.
CPC ........... *G02B 26/023* (2013.01); *G02B 26/04* (2013.01); *H02N 2/043* (2013.01); *H02N 10/00* (2013.01); *B81B 2201/045* (2013.01); *B81B 2203/0118* (2013.01); *B81B 2203/0315* (2013.01); *B81B 2203/0384* (2013.01); *B81B 2203/051* (2013.01)

(58) Field of Classification Search
CPC ..... B81B 2203/0118; B81B 2203/0384; B81B 2203/051; G02B 26/02; G02B 26/04; G02B 26/023; H02N 10/00; H02N 2/043
See application file for complete search history.

(56) References Cited

U.S. PATENT DOCUMENTS

| | | | |
|---|---|---|---|
| 5,050,838 A | 9/1991 | Beatty et al. | |
| 5,058,856 A | 10/1991 | Gordon et al. | |
| 5,061,642 A | 10/1991 | Fujioka | |
| 5,069,419 A | 12/1991 | Jerman | |
| 5,130,268 A | 7/1992 | Liou et al. | |
| 5,163,463 A * | 11/1992 | Gassman | F15B 5/003 137/82 |
| 5,180,623 A | 1/1993 | Ohnstein | |
| 5,238,223 A | 8/1993 | Mettner et al. | |
| 5,325,880 A | 7/1994 | Johnson et al. | |
| 5,355,712 A | 10/1994 | Petersen et al. | |
| 5,506,919 A | 4/1996 | Roberts | |
| 5,529,279 A | 6/1996 | Beatty et al. | |
| 5,534,111 A | 7/1996 | Hocker et al. | |
| 5,600,174 A | 2/1997 | Reay et al. | |
| 5,681,024 A | 10/1997 | Lisec et al. | |
| 5,682,053 A | 10/1997 | Wiszniewski | |
| 5,741,740 A | 4/1998 | Jang et al. | |
| 5,783,854 A | 7/1998 | Dries et al. | |
| 5,785,295 A | 7/1998 | Tsai | |
| 5,862,003 A | 1/1999 | Saif et al. | |
| 5,883,310 A | 3/1999 | Ho et al. | |
| 5,903,380 A | 5/1999 | Motamedi et al. | |
| 5,909,078 A | 6/1999 | Wood et al. | |
| 5,955,817 A | 9/1999 | Dhuler et al. | |
| 5,962,949 A | 10/1999 | Dhuler et al. | |
| 5,994,816 A | 11/1999 | Dhuler et al. | |
| 6,002,132 A | 12/1999 | Mooney et al. | |
| 6,023,121 A | 2/2000 | Dhuler et al. | |
| 6,070,851 A | 6/2000 | Tsai et al. | |
| 6,114,794 A | 9/2000 | Dhuler et al. | |
| 6,124,663 A | 9/2000 | Haake et al. | |
| 6,126,311 A | 10/2000 | Schuh | |
| 6,137,206 A | 10/2000 | Hill | |
| 6,140,646 A | 10/2000 | Busta et al. | |
| 6,167,185 A | 12/2000 | Smiley et al. | |
| 6,173,105 B1 | 1/2001 | Aksyuk et al. | |
| 6,211,598 B1 | 4/2001 | Dhuler et al. | |
| 6,218,762 B1 | 4/2001 | Hill et al. | |
| 6,236,139 B1 | 5/2001 | Hill et al. | |
| 6,239,685 B1 | 5/2001 | Albrecht et al. | |
| 6,246,826 B1 | 6/2001 | O'Keefe et al. | |
| 6,255,757 B1 | 7/2001 | Dhuler et al. | |
| 6,262,512 B1 | 7/2001 | Mahadevan | |
| 6,268,952 B1 | 7/2001 | Godil et al. | |
| 6,275,320 B1 * | 8/2001 | Dhuler | B81B 3/0054 310/306 |
| 6,291,922 B1 | 9/2001 | Dhuler | |
| 6,309,077 B1 | 10/2001 | Saif et al. | |
| 6,324,748 B1 | 12/2001 | Dhuler et al. | |
| 6,333,583 B1 | 12/2001 | Mahadevan et al. | |
| 6,351,580 B1 | 2/2002 | Dhuler et al. | |
| 6,360,539 B1 * | 3/2002 | Hill | H01H 1/0036 310/306 |
| 6,367,252 B1 | 4/2002 | Hill et al. | |
| 6,428,173 B1 | 8/2002 | Dhuler et al. | |
| 6,465,929 B1 | 10/2002 | Levitan et al. | |
| 6,523,560 B1 | 2/2003 | Williams et al. | |
| 6,557,436 B1 * | 5/2003 | Hetrick | F16H 21/44 267/165 |
| 6,596,147 B2 | 7/2003 | Hill et al. | |
| 6,675,578 B1 | 1/2004 | Sinclair | |
| 6,707,981 B2 | 3/2004 | He | |
| 6,775,459 B2 | 8/2004 | Hong et al. | |
| 6,816,295 B2 | 11/2004 | Lee et al. | |
| 6,838,738 B1 | 1/2005 | Costello et al. | |
| 6,853,765 B1 | 2/2005 | Cochran | |
| 6,901,204 B2 | 5/2005 | Hong et al. | |
| 6,980,727 B1 | 12/2005 | Lin et al. | |
| 6,982,515 B2 | 1/2006 | Howell et al. | |
| 7,007,471 B2 * | 3/2006 | Sinclair | B81B 3/0024 310/307 |
| 7,113,689 B2 | 9/2006 | Hong et al. | |
| 7,242,825 B2 | 7/2007 | Lin et al. | |
| 7,298,954 B2 | 11/2007 | Liu et al. | |
| 7,346,240 B1 | 3/2008 | He et al. | |
| 7,492,994 B1 | 2/2009 | He et al. | |
| 7,567,011 B1 | 7/2009 | Jean et al. | |
| 7,855,682 B2 | 12/2010 | Gould et al. | |
| 7,982,361 B2 | 7/2011 | Maeda et al. | |
| 8,666,218 B2 | 3/2014 | He et al. | |
| 9,256,065 B1 | 2/2016 | Jin et al. | |
| 2002/0113281 A1 | 8/2002 | Cunningham et al. | |
| 2003/0021512 A1 | 1/2003 | Guerin et al. | |
| 2003/0101721 A1 * | 6/2003 | Janssen | B81B 3/0024 60/528 |
| 2003/0156817 A1 | 8/2003 | He | |
| 2004/0126081 A1 | 7/2004 | Hong et al. | |
| 2004/0136680 A1 | 7/2004 | Medina et al. | |
| 2004/0190818 A1 | 9/2004 | Telkamp et al. | |
| 2004/0229440 A1 | 11/2004 | Kim et al. | |
| 2005/0047721 A1 | 3/2005 | Chen et al. | |
| 2005/0082916 A1 | 4/2005 | Ohashi et al. | |
| 2005/0264131 A1 | 12/2005 | Hong | |
| 2006/0034562 A1 | 2/2006 | German et al. | |
| 2006/0127029 A1 | 6/2006 | Lin et al. | |
| 2007/0230865 A1 | 10/2007 | Dames et al. | |
| 2008/0205845 A1 | 8/2008 | Wang et al. | |
| 2010/0045141 A1 | 2/2010 | Pulskamp et al. | |
| 2010/0308690 A1 | 12/2010 | Currano et al. | |
| 2011/0102875 A1 | 5/2011 | Yang et al. | |
| 2011/0217018 A1 * | 9/2011 | He | B23P 11/00 385/140 |
| 2012/0133427 A1 * | 5/2012 | Kim | H01L 23/34 327/564 |
| 2012/0307335 A1 | 12/2012 | Kuriyagawa | |
| 2013/0021656 A1 | 1/2013 | Albus et al. | |
| 2013/0050290 A1 * | 2/2013 | Andersson | B81B 3/007 345/690 |
| 2013/0341300 A1 | 12/2013 | Kim et al. | |
| 2015/0277103 A1 | 10/2015 | Yin et al. | |
| 2017/0183217 A1 | 6/2017 | Yin et al. | |
| 2018/0239127 A1 | 8/2018 | Nishiki et al. | |

OTHER PUBLICATIONS

Benecke et al., Applications of Silicon-Microactuators Based on Bimorph Structures. IEEE Micro Electro Mechanical Systems, Proceedings, An Investigation of Micro Structures, Sensors, Actuators, Machines and Robots. Feb. 20-22, 1989, pp. 116-120.

Comtois et al., Design techniques for surface-micromachining MEMS processes. SPIE. Sep. 19, 1995;2639:211-222.

(56) References Cited

OTHER PUBLICATIONS

Comtois, et al., Thermal microactuators for surface-micromachining processes. SPIE. Sep. 15, 1995;2642:10-21.
Fedder et al., Thermal Assembly of Polysilicon Microstructures. Proceedings, IEEE Micro Electro Mechanical Systems. pp. 63-68, Jan. 1991.
Field et al., Micromachined 1×2 Optical Fiber Switch. Transducers '95 —Eurosensors IX, The 8th International Conference on Solid-State Sensors and Actuators, and Eurosensors IX. pp. 344-347, Jun. 25-29, 1995.
Guckel et al., Thermo-magnetic Metal Flexure Actuators. Technical Digest IEEE Solid-State Sensor and Actuator Workshop. Jun. 22-25, 1992, pp. 73-75.
Jerman, Electrically-activated, normally-closed diaphragm valves. J Micromech Microeng. Dec. 1994;4:210-216.
Judy et al., Surface Micromachined Linear Thermal Microactuator. International Technical Digest on Electron Devices. Dec. 9-12, 1990, pp. 26.5.1-26.5.4.
Kersjes et al., A fast liquid flow sensor with thermal isolation by oxide-filled trenches. Sensors and Actuators A Physical. Mar.-Apr. 1995;47(1-3):373-379.
Kersjes et al., An integrated sensor for invasive blood-velocity measurement. Sensors and Actuators A. Jun.-Aug. 1993;37-38:674-678.
Klaassen et al., Micromachined thermally isolated circuits. Sensors and Actuators A Physical. Jan. 1997;58(1):43-50.
Klaassen et al., Micromachined Thermally Isolated Circuits. Solid-State and Actuator Workshop. Jun. 2-6, 1996, pp. 127-131.
Klaassen et al., Silicon Fusion Bonding and Deep Reactive Ion Etching; a New Technology for Microstructures. The 8th International Conference on Solid-State Sensors and Actuators, and Eurosensors IX. Transducers '95—Eurosensors IX. Jun. 25-29, 1995, pp. 556-559.
Lerch et al., Modelization and characterization of asymmetrical thermal micro-actuators. J Micromech Microeng. Mar. 1996;6(1):134-137.
Maluf et al., Single Crystal Silicon Actuators and Sensors Based on Silicon Fusion Bonding Technology. Semi-Annual Progress Report 1, Contract No. DAAL 01-94-C-3411 Sponsored by the Advanced Research Projects Agency. 14 pages, Jul. 1994.
Maluf et al., Single Crystal Silicon Actuators and Sensors Based on Silicon Fusion Bonding Technology. Semi-Annual Progress Report 2, Contract No. DAAL 01-94-C-3411 Sponsored by the Advanced Research Projects Agency. 20 pages, Jan. 1995.
Maluf, An Introduction to Microelectromechanical Systems Engineering. Artech House, Inc. 277 pages, (2000).
Nguyen, Micromachined flow sensors—a review. Flow Meas Instrum. Mar. 1997;8(1):7-16.
Noworolski et al., Fabrication of SOI wafers with buried cavities using silicon fusion bonding and electrochemical etchback. Sensors and Actuators A Physical. Jun. 1996;54(1-3):709-713.
Noworolski et al., Fabrication of SOI wafers with buried cavities using silicon fusion bonding and electrochemical etchback. The 8th International Conference on Solid-State Sensors and Actuators, and Eurosensors IX. Transducers '95—Eurosensors IX. Jun. 25-29, 1995, pp. 71-74.
Oh et al., Thin Film Heater on a Thermally Isolated Microstructure. Materials Research Society Symposium Proceedings. pp. 277-282, (1990).
Pan et al., An electro-thermally and laterally driven polysilicon microactuator. J Micromech Microeng. Mar. 1997;7(1):7-13.
Paul et al., Thermal conductivity of CMOS materials for the optimization of microsensors. J Micromech Microeng. Sep. 1993;3:110-112.
Petersen, Silicon as a Mechanical Material. Proceedings of the IEEE. May 1982;70(5):420-457.
Phipps, Design and Development of Microswitches for Micro-Electro-Mechanical Relay Matrices. Thesis. Presented to the Faculty of the Graduate School of Engineering of the Air Force Institute of Technology, Air University. In Partial Fulfillment of the Requirements for the Degree of Master of Science in Electrical Engineering. 254 pages, Jun. 1995.
Safranek, The Properties of Electrodeposited Metals and Alloys: A Handbook. Amer Electroplaters Soc. pp. 295-315, (1986).
Shoji et al., Microflow devices and systems. J Micromech Microeng. Dec. 1994;4(4):157-171.
Wood et al., MEMS Microrelays. Mechatronics. Aug. 1, 1998;8:535-547.
Yamagata et al., A Micro Mobile Mechanism Using Thermal Expansion and Its Theoretical Analysis. A comparison with Impact Drive Mechanism using piezoelectric elements. Proceedings IEEE Micro Electro Mechanical Systems an Investigation of Micro Structures, Sensors, Actuators, Machines and Robotic Systems. pp. 142-147, Jan. 25-28, 1994.
Comtois, John H., and Victor M. Bright. "Surface micromachined polysilicon thermal actuator arrays and applications." Proc. Solid-State Sensor and Actuator Workshop. Jun. 1996.
Klaassen, Erno H., et al. "Silicon fusion bonding and deep reactive ion etching: a new technology for microstructures." Sensors and Actuators A: Physical 52.1 (Mar. 1996): 132-139.
Lisec, T., et al. "Thermally driven microvalve with buckling behaviour for pneumatic applications." IEEE Workshop on Micro Electro Mechanical Systems, MEMS'94, Proceedings, IEEE, Jan. 1994.
Maluf, N. et al. "Single Crystal Silicon Actuators and Sensors Based on Silicon Fusion Bonding Technology." Lucas Novasensor Semiannual Progress Report for the Reporting Period Jan. 1995 to Jul. 1995, ARPA Contract No. DAAL 01-94-C-3411, Jul. 1995.
Maluf, N. et al. "Single Crystal Silicon Actuators and Sensors Based on Silicon Fusion Bonding Technology." Semiannual Progress Report for the Reporting Period Jan. 1996 to Aug. 1996 (Aug. 1996). Contract No. DAAL 01-94-C-3411 Sponsored by the Advanced Research Projects Agency.
Noworolski, J. Mark, et al. "Process for in-plane and out-of-plane single-crystal-silicon thermal microactuators." Sensors and Actuators A: Physical 55.1 (Jul. 1996): 65-69.
Peterson, K. et al., "Single Crystal Silicon Actuators and Sensors Based on Silicon Fusion Bonding Technology." Prepared for Advanced Research Projects Agency, Contract No. DAAL 01-94-C-3411, Reporting Period: Apr.-Jul 1994 (Jul. 1994).
Peterson, K. et al., "Single Crystal Silicon Actuators and Sensors Based on Silicon Fusion Bonding Technology." Semi-Annual Progress Report 2 prepared for Advanced Research Projects Agency, Contract No. DAAL 01-94-C03411, Reporting Period: Jul. 1994-Jan. 1995 (Jan. 1995).
Que, Long, J-S. Park, and Y. B. Gianchandani. "Bent-beam electro-thermal actuators for high force applications." Twelfth IEEE International Conference on Micro Electro Mechanical Systems. MEMS'99. IEEE, Jan. 1999.
U.S. Appl. No. 15/300,212, filed Sep. 28, 2016, 2017-0183217, Published.
Asheghi et al., Thermal conduction in doped single-crystal silicon films. Journal of Applied Physics. Apr. 15, 2002;91(8):5079-88.
Blinder, Doped Silicon Semiconductors. Wolfram Demonstrations Project. Retrieved online at: http://demonstrations.wolfram.com/DopedSiliconSemiconductors/. Wolfram Technologies. 8 pages, Mar. 2011.
Isamoto et al., A 5-V Operated MEMS Variable Optical Attenuator by SOI Bulk Micromachining. IEEE J Sel Topics Quant Elect. May/Jun. 2004;10(3):570-8.
Que et al., Bent-beam electrothermal actuators—Part I: Single beam and cascaded devices. Journal of Microelectromechanical Systems. Jun. 2001;10(2):247-54.
Sun et al., Lateral In-plane Displacement Microactuators with Combined Thermal and Electrostatic Drive. Solid-State Sensors and Actuator Workshop. pp. 152-155, Jun. 2-6, 1996.
Van Exter et al., Optical and electronic properties of doped silicon from 0.1 to 2 THz. Appl Phys Lett. Apr. 1990;56(17):1694-96.

\* cited by examiner

Direct light from a first optical fiber to a MEMS displacement structure, the MEMS displacement structure including, for example, a MEMS shutter, a first contact, a second contact, and a motion actuator having a first thermally actuated beam and a second thermally actuated beam that are coupled at an output portion of the motion actuator, wherein the MEMS shutter is coupled to a first shutter beam and a second shutter beam, a first end of the first shutter beam coupled to a fixture site of the MEMS displacement structure, and a first end of the second shutter beam coupled to the motion actuator at the output portion
602

↓

Displace the MEMS shutter from a first position to a second position by adjusting a voltage or a current between the first contact and the second contact, the first position obstructing a first portion of the light from passing to a second optical fiber, the second position obstructing a second portion of the light from passing to the second optical fiber
604

↓

Receive passed light from the MEMS displacement structure at a second optical fiber.
606

↓

Measure an operational characteristic of the MEMS shutter or the motion actuator.
608

↓

Adjust the voltage or current between the first contact and the second contact using a control circuit based on the value of the operational characteristic
610

MICROELECTROMECHANICAL DISPLACEMENT STRUCTURE AND METHOD FOR CONTROLLING DISPLACEMENT

CROSS-REFERENCE TO RELATED APPLICATIONS

This application claims the benefit of U.S. Provisional Application 62/235,153 filed on Sep. 30, 2015, and to U.S. application Ser. No. 15/300,212 filed Sep. 28, 2016, which claims priority to International Application No. PCT/US2015/022117 filed Mar. 24, 2015, which claims priority to U.S. application Ser. No. 14/242,328 filed Apr. 1, 2014, and U.S. application Ser. No. 14/529,602, filed Oct. 31, 2014. The above applications are incorporated herein by reference in their entirety.

TECHNICAL FIELD

The present disclosure relates to a microelectromechanical systems (MEMS) displacement structure and a method for controlling displacement. More particularly, the present disclosure relates to a MEMS displacement structure that can generate a large displacement by a small actuation motion and a method for controlling displacement.

BACKGROUND

MEMS structures that are capable to generate a large displacement have wide uses in various applications, such as optical shutter for laser, variable optical actuator for fiber, optical switch, etc. However, MEMS devices are intrinsically small in size. Therefore, efficient mechanical motion amplification structure is critical for many commercial applications.

Several MEMS displacement amplification designs have been reported. These designs, however, have deficiencies for practical use. In one case, an electrostatic actuator with amplifier can only generate a displacement of less than 200 microns. In order to reach such displacement, a very high voltage is required to generate the necessary force for this type of structure. In another case, a thermal actuator amplifier can be driven at a low voltage. However, traditional thermal actuators can only generate a displacement of around 10-12 microns.

The market needs a MEMS structure that can generate a displacement of more than 500 microns within a small chip footprint. Accordingly, there is a need to develop a new MEMS structure that can generate a displacement of more than 500 microns within a small chip footprint and that can be produced at very low cost.

SUMMARY

A MEMS structure that can generate a large displacement, more than 500 microns, in one instance, within a small chip footprint is disclosed herein below.

In one aspect, the present disclosure provides a displacement amplification structure. The displacement amplification structure comprises a first beam and a second beam substantially parallel to the first beam, an end of the first beam coupled to a fixture site, and an end of the second beam coupled to a motion actuator; and a motion shutter coupled to an opposing end of the first and second beams; wherein, in response to a displacement of the motion actuator along an axis direction of the second beam, the motion shutter displaces along a transversal direction substantially perpendicular to the axis direction. The displacement of the motion actuator may be caused, for example, but not limited to, by one of thermal expansion, motion driven by piezo-electricity, motion driven by magnetic force, and motion driven by electrostatic force. The motion shutter may have, for example, but not limited to, a shape selected from one of a square, a rectangle, a circle, an oval, and a polygon.

In one embodiment, the displacement of the motion actuator along the axis direction ranges from about 25 to about 50 microns, and the motion shutter displaces a distance along the transversal direction for about 500 to 1,000 microns.

In one embodiment, the first and second beams have a strip shape and comprise an elastic material. The elastic material can comprise single crystal silicon as described herein. The beams connected to the motion shutter can extend from the silicon layer of a silicon on insulator (SOI) structure as described herein. The beams of the V-shaped motion actuator that is coupled to the shutter can be doped to select the conductivity of the thermal actuator, which can be different than the conductivity of the beams attached to the shutter. The shutter can include a reflective material to deflect a light beam for detection and feedback control as described herein.

According to another aspect, the present disclosure provides a MEMS device. The MEMS device comprises a frame including a fixture site, the frame defining an actuating region and a response region; first and second electrodes in the actuating region and mechanically coupled to the frame; a motion actuator in the actuating region and electrically coupled to the first and second electrodes; first and second beams in the response region, the second beam being substantially parallel to the first beam, wherein an end of the first beam is coupled to the fixture site, and an end of the second beam is coupled to the motion actuator; and a motion shutter in the response region and mechanically coupled to an opposing end of the first and second beams.

In one embodiment, the motion actuator is configured to cause a displacement of the second beam along an axis direction of the second beam in response to a voltage applied to the motion actuator through the first and second electrodes.

In one embodiment, the motion actuator is configured to have an angled shape having a vertex portion and an interior angle ranging from about 120 degrees to about 180 degrees.

In one embodiment, the motion actuator comprises an electrothermal material used to create a thermomechanical action. The device operates at high switching speeds and at low power. To achieve the requisite switching speed, the thermal cycling of the actuated beams must also match this requirement. Thus, the beams must have substantially improved thermal coupling to the silicon substrate. The beams are consequently mounted to the substrate to increase thermal transport away from the beam when the actuating current is switched off. The switch operates at speeds less than 5 ms and preferably less than 100 µs per switch cycle.

In one embodiment, the motion shutter displaces a distance along a transverse direction substantially perpendicular to the axis direction, in response to the displacement of the motion actuator. The shutter can undergo an arcuate movement from the closed position to the open position where the beams are substantially parallel in the closed position and bend to different arcs so that they are not parallel in the open position.

In one embodiment, the second beam is mechanically coupled to the vertex portion of the motion actuator. As previously described, the beams can comprise the silicon layer of an SOI structure that have been released from the underlying insulating substrate.

According to one aspect, the present disclosure provides a method for controlling a motion shutter. The method comprises providing a MEMS device comprising a frame including a fixture site, the frame defining an actuating region and a response region, first and second electrodes in the actuating region and mechanically coupled to the frame, a motion actuator in the actuating region and electrically coupled to the first and second electrodes, first and second beams in the response region, the second beam being substantially parallel to the first beam, wherein an end of the first beam is coupled to the fixture site, and an end of the second beam is coupled to the motion actuator, a motion shutter in the response region and mechanically coupled to an opposing end of the first and second beams; and applying a voltage to the first and second electrodes to cause a displacement of the motion actuator along the axis direction; wherein, in response to the displacement of the motion actuator, the motion shutter displaces a distance along a transversal direction substantially perpendicular to the axis direction.

BRIEF DESCRIPTION OF THE DRAWINGS

The present disclosure is to be read in conjunction with the accompanying drawings, in which.

DETAILED DESCRIPTION

The following detailed description is of the best currently contemplated modes of carrying out the present disclosure. The description is not to be taken in a limiting sense, but is made merely for the purpose of illustrating the general principles of the present disclosure, because the scope of the present disclosure is defined by the appended claims.

As used herein, the singular forms "a," "an," and "the" include the plural reference unless the context clearly dictates otherwise.

Except where otherwise indicated, all numbers expressing quantities of ingredients, reaction conditions, and so forth used in the specification and the claims are to be understood as being modified in all instances by the term "about."

Further, any quantity modified by the term "about" or the like should be understood as encompassing a range of ±10% of that quantity.

For the purposes of describing and defining the present disclosure, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Figure 1A:
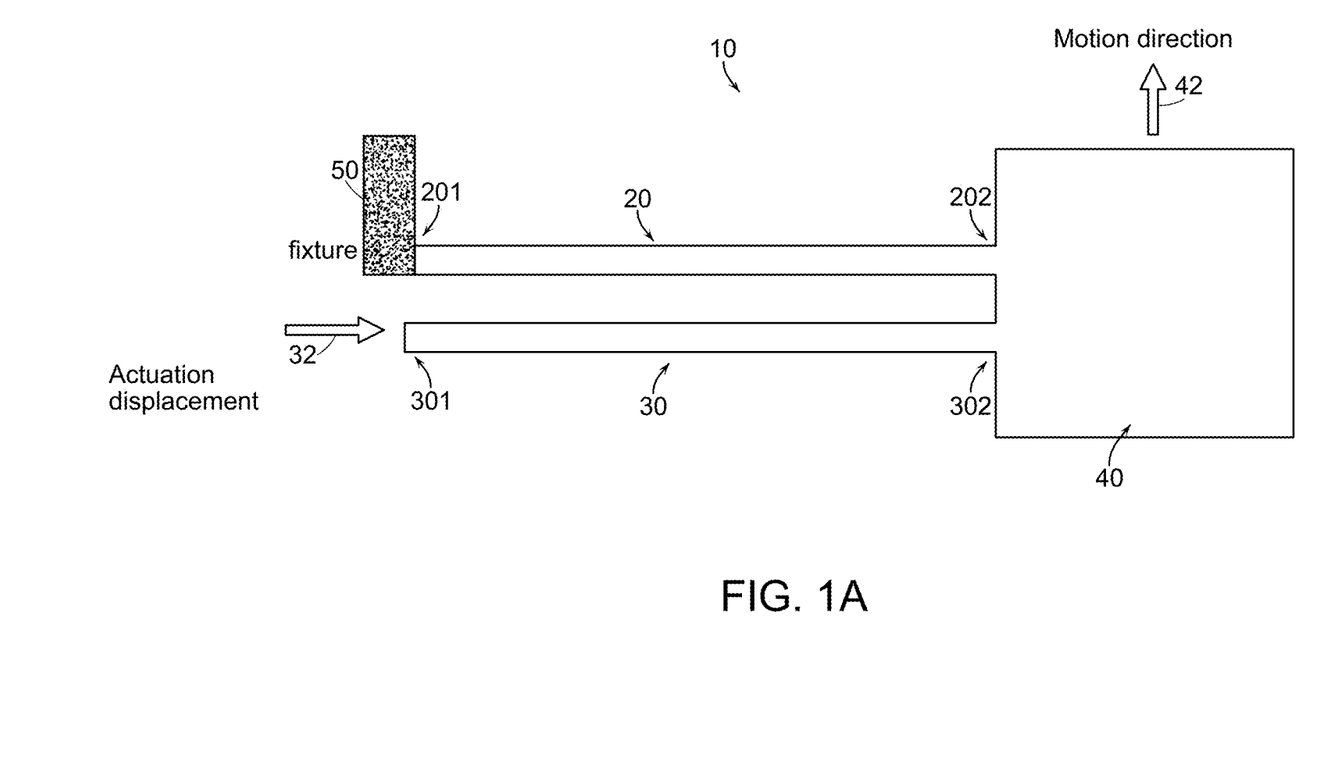
FIGS. 1A-1C illustrate MEMS displacement amplification structures, in accordance with preferred embodiments of the present disclosure.

FIG. 1A illustrates a MEMS displacement amplification structure, in accordance with one embodiment of the present disclosure. As shown in FIG. 1A, a displacement amplification structure 10 includes first and second beams 20 and 30 that are closely posed and substantially parallel to each other. In one embodiment, first and second beams 20 and 30 have a strip shape, and comprise an elastic or flexible material, such as silicon. In one embodiment, first and second beams 20 and 30 are separated with each other by a gap of about 20 to 75 microns.

As shown in FIG. 1A, end 201 of first beam 20 is fixed to an immobilized fixture 50. End 301 of second beam 30 has a degree of freedom along an axis direction 32 of second beam 30. Ends 202 and 302 of beams 20 and 30 are connected to a motion shutter 40. In this particular embodiment, motion shutter 40 has a square shape. It is appreciated that motion shutter 40 may have other shapes, such as, but not limited to, rectangle, triangle, circle, oval, polygon, etc. In one embodiment, motion shutter 40 is made of an opaque material, such as silicon coated with gold. Details regarding the MEMS optical signal control device are described in U.S. patent application Ser. No. 14/242,328 filed on Apr. 1, 2014, the entire contents of which is incorporated herein by reference.

A small input displacement (e.g., 25 to 50 microns) along axis direction 32 of second beam 30 at end 301 bends first and second beams 20 and 30, and causes a differential axis motion between first and second beams 20 and 30. The differential motion transfers into a large displacement (e.g., 500 to 1,000 microns) for motion shutter 40 in a transversal direction 42. The input displacement can be generated by thermal expansion, magnetic force, electrostatic force, piezoelectricity, and other suitable actuation sources.

Figure 1B:
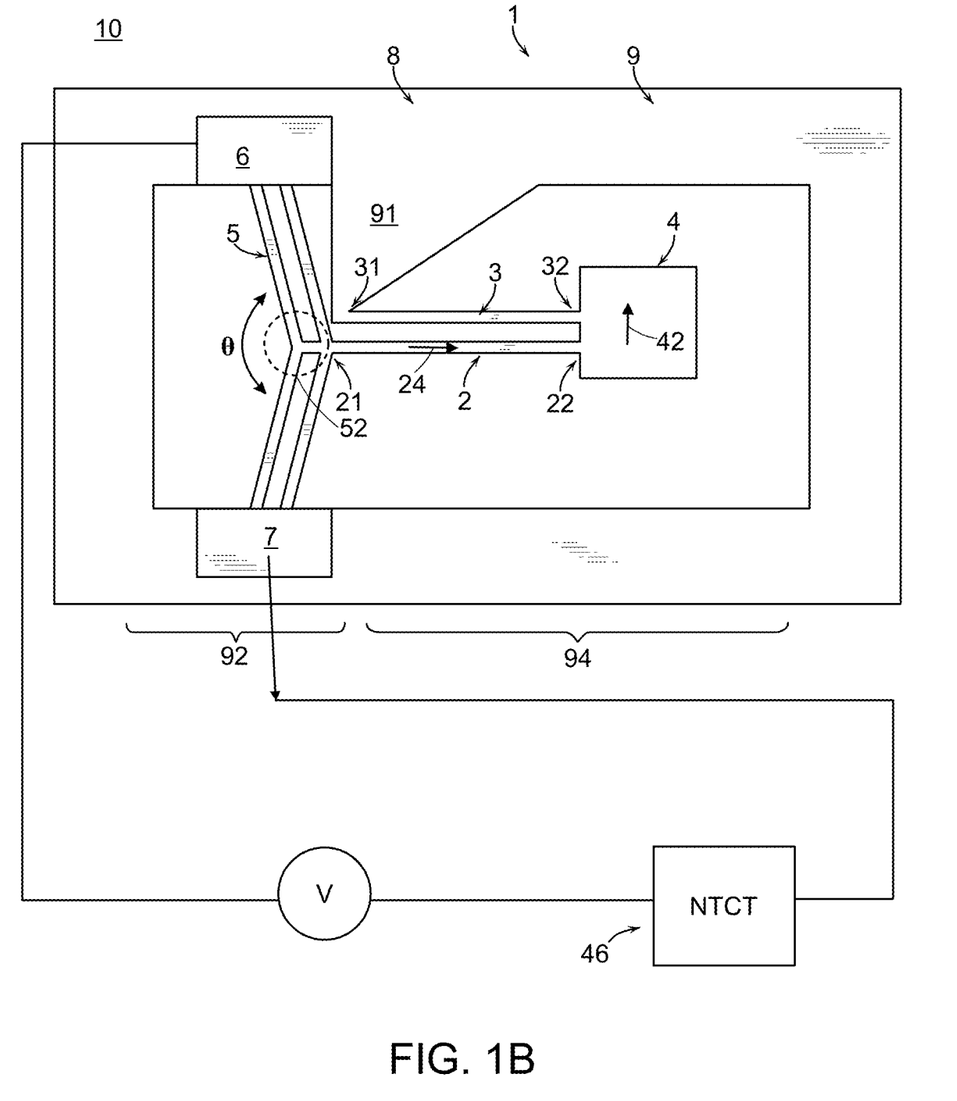
Figure 1C:
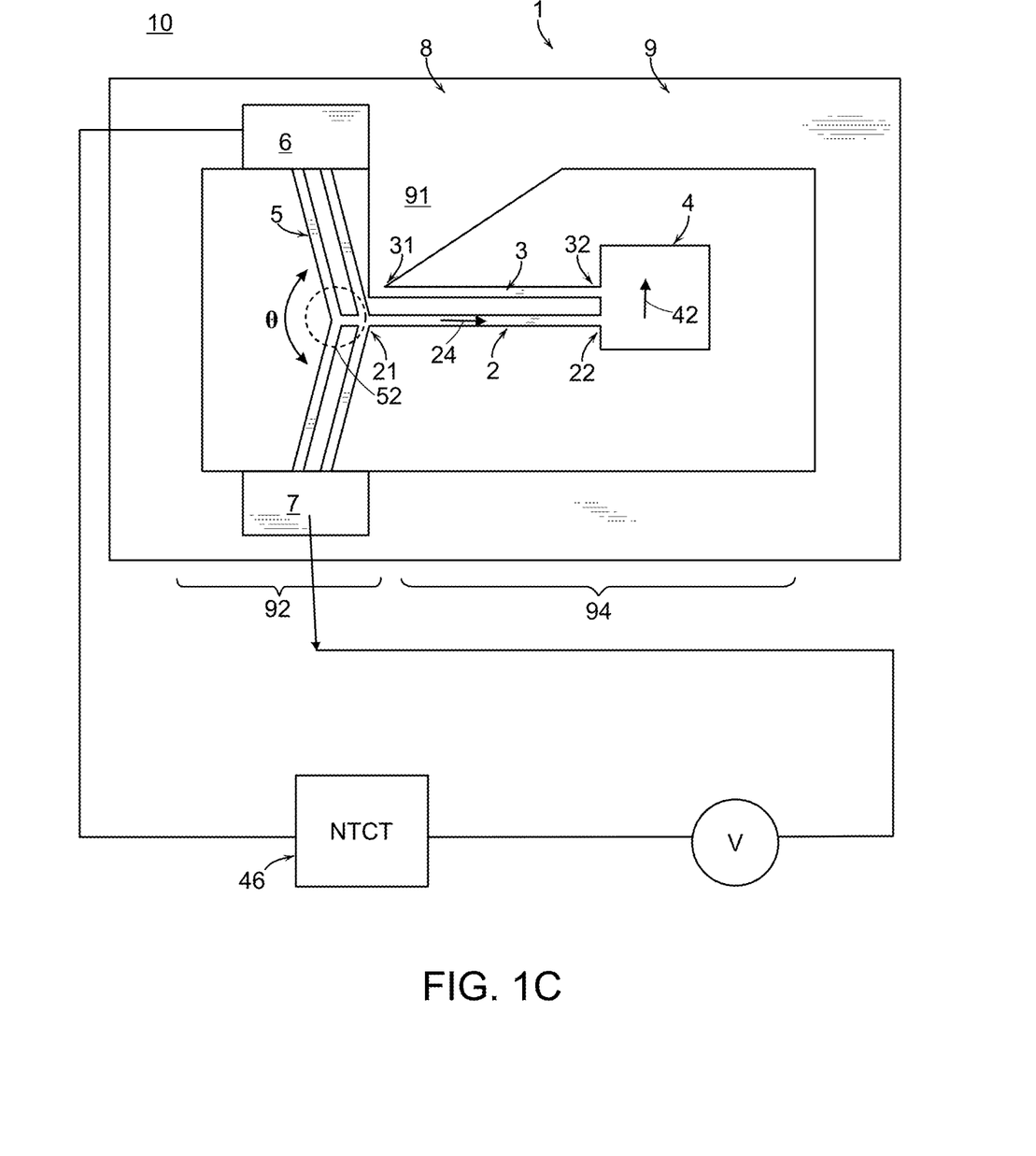

For the compact thermal actuated displacement amplification structure of FIG. 1B, for example, in embodiments using highly doped silicon, during the thermal equilibrium procedure of the device itself or environmental temperature change, the drift could be more than 1 dB. The increased resistance leads to a decreased input power to the actuator when the input voltage holds constant. The increased resistance can be at least partially corrected by a negative temperature coefficient component 46 configured to be electrically connected in series with the voltage source, V, as shown in FIG. 1B. The negative temperature coefficient component 46 can be electrically connected between the first electrode 6 and the voltage source, V, as shown in FIG. 1C, or between the voltage source, V, and the second electrode 7, as shown in FIG. 1B. Although, for brevity, other embodiments are shown connected to either the first electrode 6 or to the second electrode 7, both connections are within the scope of these teachings. In the embodiment shown in FIG. 1B, the negative temperature coefficient component 46 is a negative temperature coefficient thermistor, NTCT.

Figure 2A:
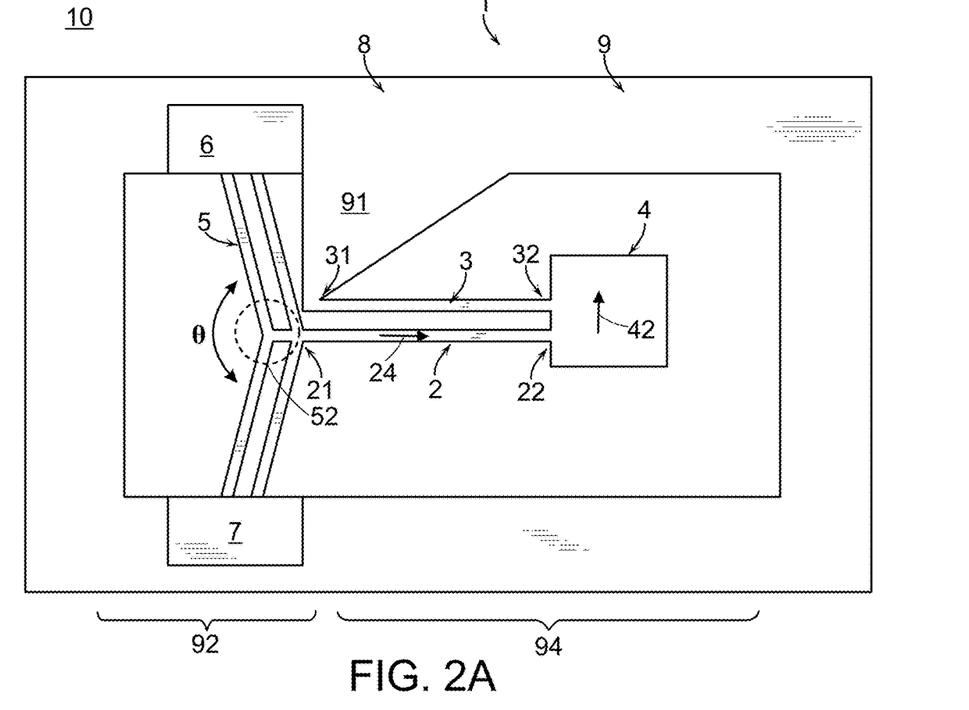
FIGS. 2A and 2B respectively illustrate a plan view and a perspective view of a MEMS displacement amplification structure, in accordance with one embodiment of the present disclosure.
Figure 2B:
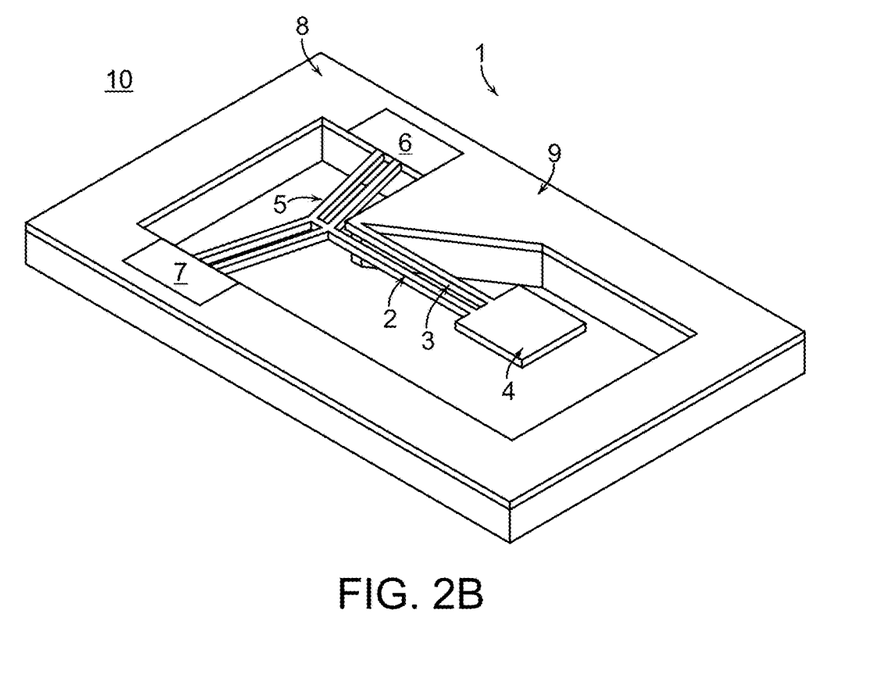

FIGS. 2A and 2B respectively illustrate a plan view and a perspective view of a MEMS displacement amplification structure, in accordance with one embodiment of the present disclosure. As shown in FIGS. 2A and 2B, a MEMS large motion structure 10 includes a frame 9 defining a planar surface 8, first and second beams 2 and 3, a motion shutter 4, a motion actuator 5, and first and second electrodes 6 and 7. In one embodiment, all of these components are configured in the same planar surface 8. First and second electrodes 6 and 7 can have enlarged surface areas to aid in thermal dissipation during fast switching operation.

Frame 9 includes a fixture site 91 and further defines an actuating region 92 and a response region 94. First and second electrodes 6 and 7 are disposed in actuating region 92 and are mechanically coupled to frame 9. Motion actuator 5 is disposed in actuating region 92 and is electrically coupled to first and second electrodes 6 and 7.

First and second beams 2 and 3 are disposed in response region 94. Second beam 3 is substantially parallel to first beam 2. End 21 of first beam 2 is connected to a central portion (or output portion) of the actuator 5. End 22 of first beam 2 is connected to motion shutter 4. End 31 of second beam 3 is coupled to and immobilized at fixture site 91. End 32 of second beam 3 is mechanically coupled to motion shutter 4. Motion shutter 4 is disposed in the response region and mechanically coupled to ends 22 and 32 of first and second beams 2 and 3.

In one embodiment, an electric current or voltage (e.g., 3 Volts) is applied to motion actuator 5 through first and second electrodes 6 and 7, so as to cause a displacement (e.g., 50 microns) of second beam 2 along an axis direction 24 of second beam 2. In response to the displacement of motion actuator 5, motion shutter 4 displaces a distance along a transversal direction 42 substantially perpendicular to axis direction 24. In one embodiment, motion actuator 5 comprises an electrothermal material.

In one embodiment, motion actuator 5 has a V-shape or an angled shape, which has a vertex portion 52 and an interior angle θ ranging from about 120 degrees to about 180 degrees. In some embodiments, motion actuator 5 may have other shapes and may include a plurality of V-beams. In one embodiment, end 21 of second beam 2 is mechanically coupled to vertex portion 52 of motion actuator 5.

When an electric current/voltage is applied to motion actuator 5, a deformation along axis direction 24 is applied to first beam 2. Such deformation generates a differential motion along axis directions between first and second beams 2 and 3. Due to the constraint along axis direction, this differential axis motion leads to a very large transversal motion of first and second beams 2 and 3. As a result, motion shutter 5 also has a very large transversal motion. In certain embodiments, the transversal motion of motion shutter 5 can be more than 500-1,000 microns within a compact chip size of less than 4 mm. In one embodiment, MEMS structure 10 can be formed from a silicon-on-insulator (SOI) silicon wafer.

Figure 3A:
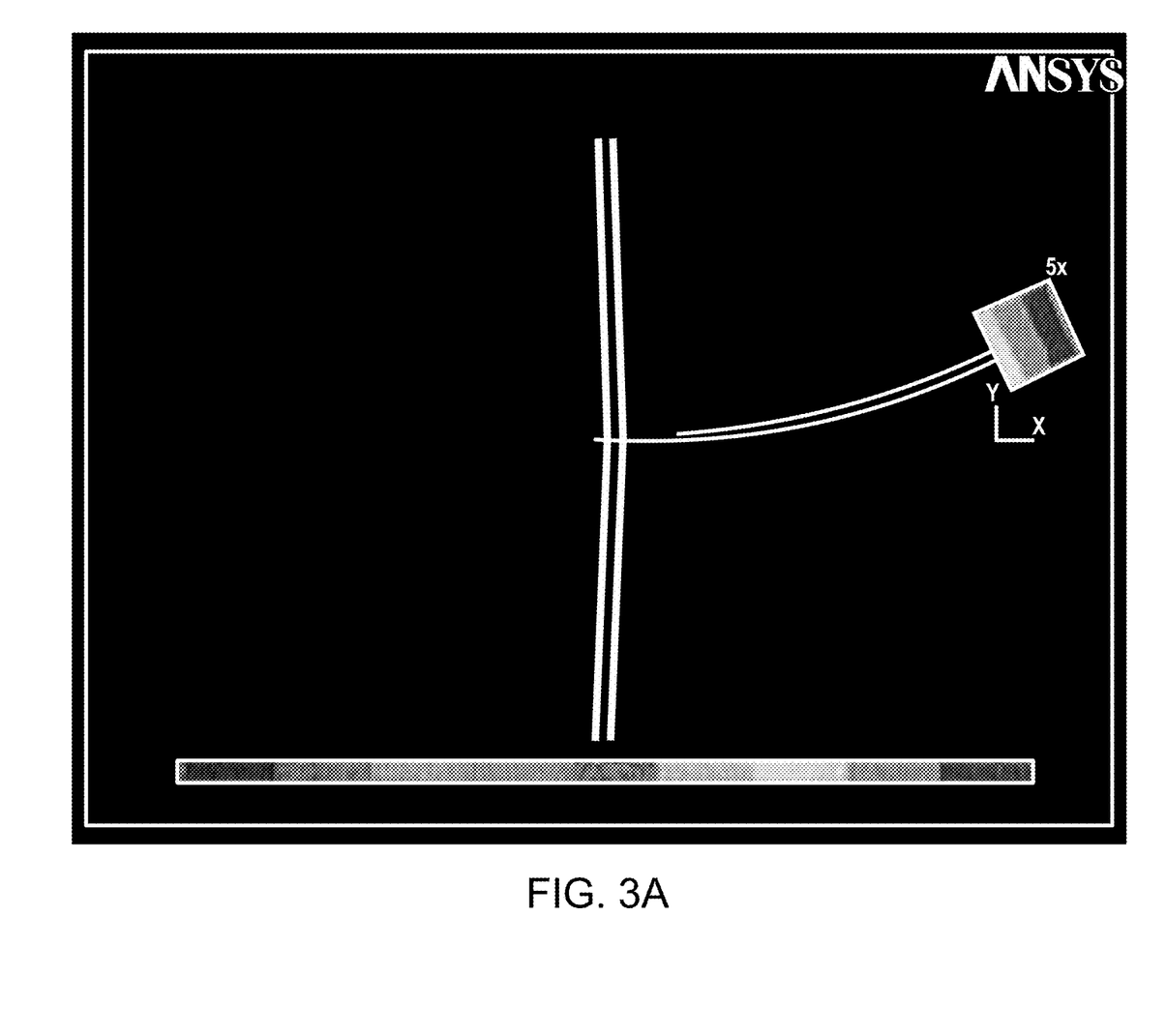
FIG. 3A illustrates a simulation result of a MEMS displacement amplification structure, in accordance with one embodiment of the present disclosure.

FIG. 3A illustrates a simulation result of a MEMS displacement amplification structure, in accordance with one embodiment of the present disclosure. Note that the shutter beams are not parallel in the displaced position.

Figure 3B:
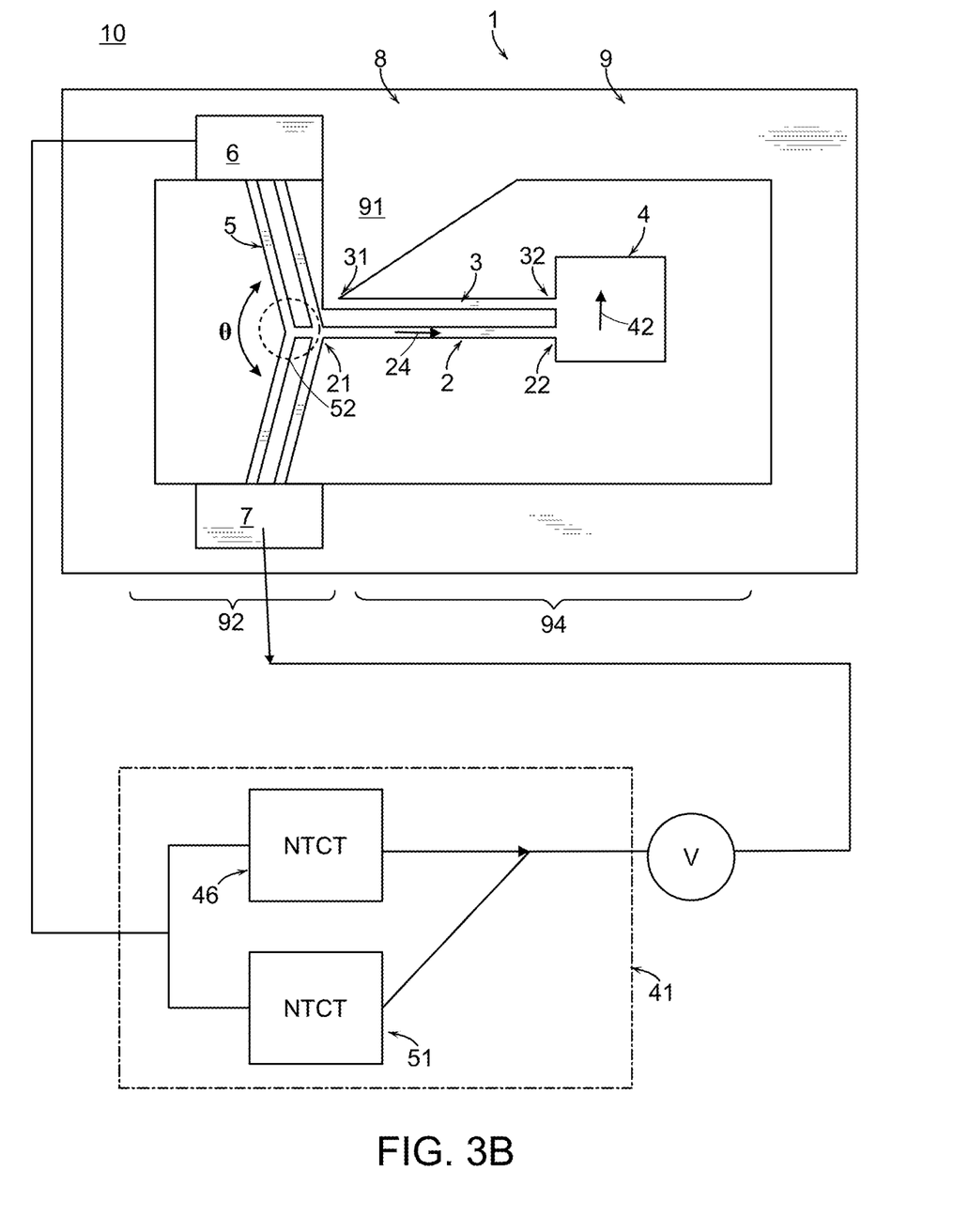
FIGS. 3B, 3C and 3D illustrate control circuits for driving MEMS actuation in accordance with the invention.
Figure 4:
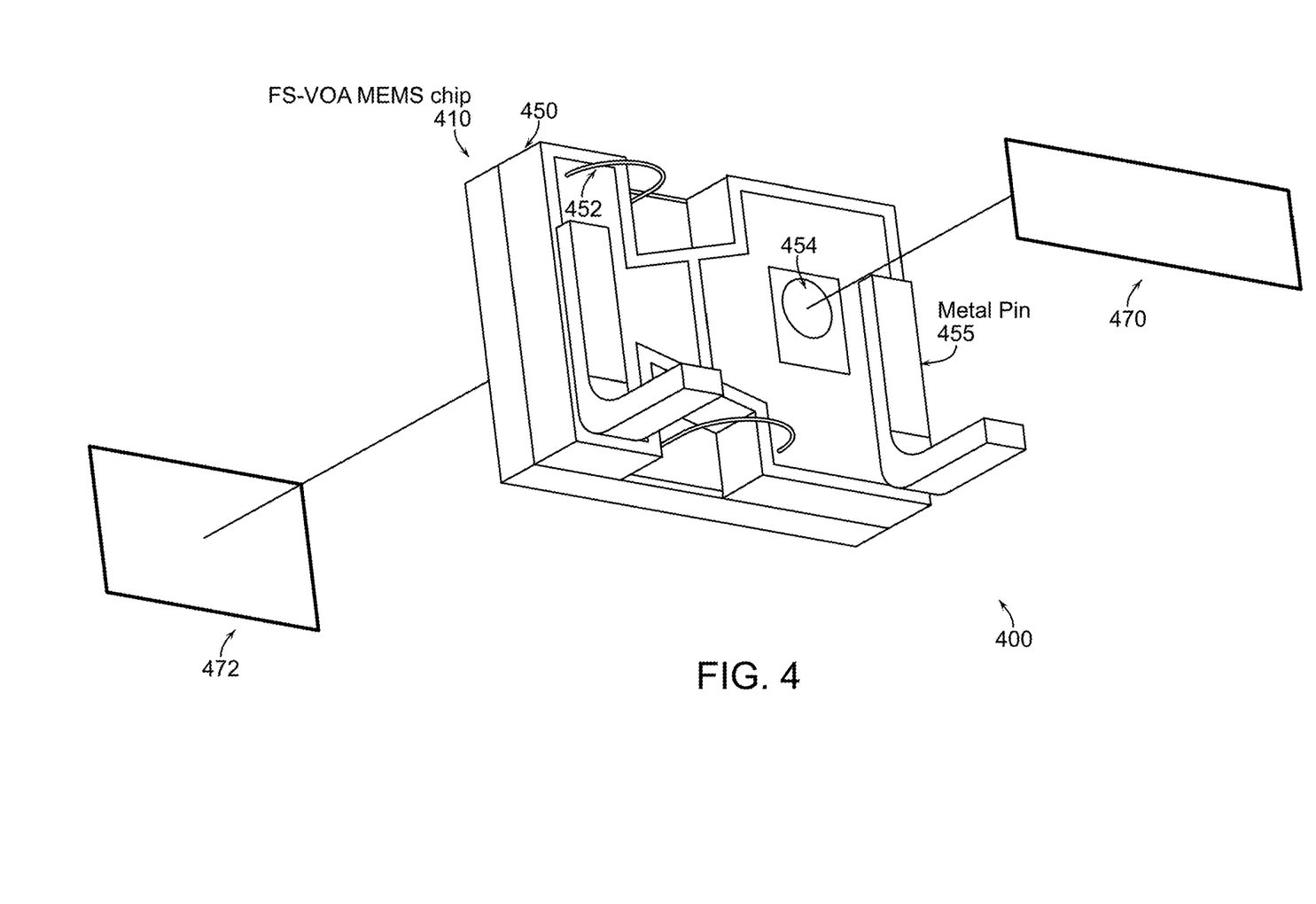
FIG. 4 illustrates a perspective view of a MEMS displacement amplification structure in accordance with various embodiments of the present disclosure.

An embodiment of a negative temperature coefficient component 41 is used in the embodiment of the system shown in FIG. 3B. Referring to FIG. 4, in the embodiment shown there in, the negative temperature coefficient component 41 includes a first negative temperature coefficient thermistor 46 electrically connected in parallel with a second negative temperature coefficient thermistor 51.

Figure 3C:
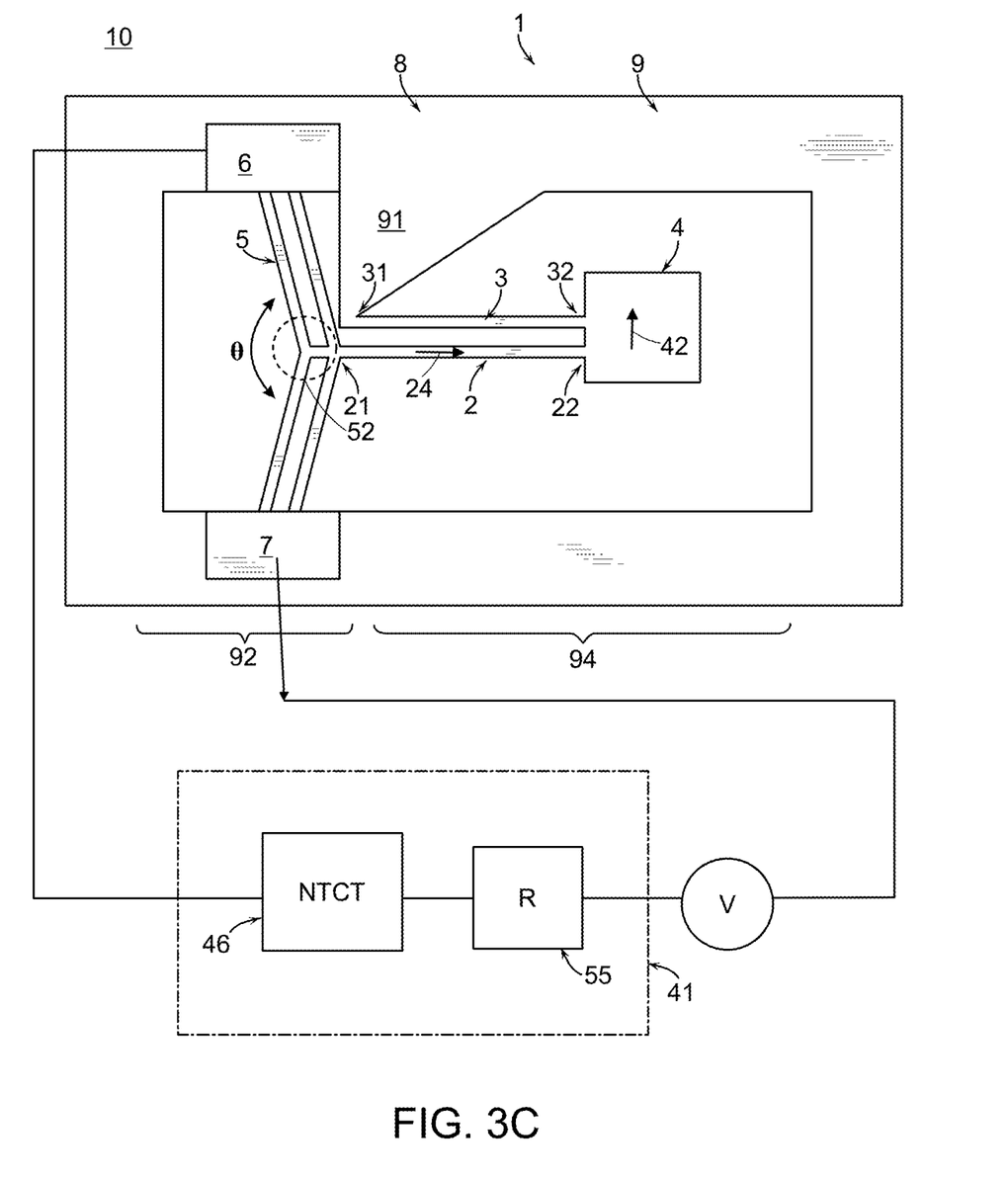

A further embodiment of the negative temperature coefficient component 41 is used in the embodiment of the system shown in FIG. 3C. Referring to FIG. 3C and the embodiment shown therein, the negative temperature coefficient component 41 includes a negative temperature coefficient thermistor 46 electrically connected in series to a resistor 55.

Figure 3D:
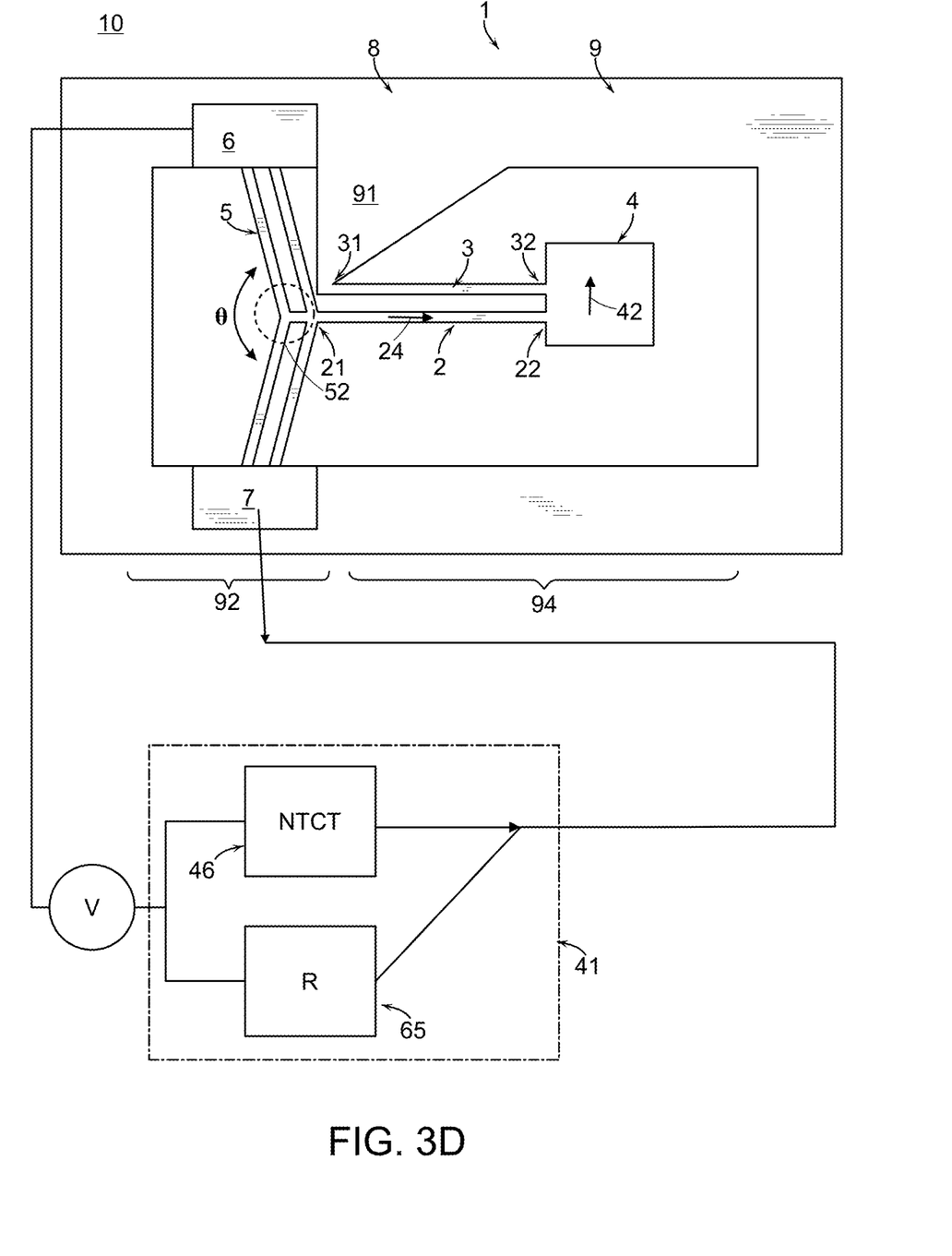

Yet another embodiment of the negative temperature coefficient component 41 is used in the embodiment of the system shown in FIG. 3D. Referring to FIG. 3D and the embodiment shown therein, the negative temperature coefficient component 41 includes a negative temperature coefficient thermistor 46 electrically connected in parallel to a resistor 65.

During use of the system of these teachings, a negative temperature coefficient component is electrically connected in series with one of a first electrode or a second electrode of the variable optical attenuator of these teachings. The negative temperature coefficient component is configured to be electrically connected in series with a voltage source, the voltage source configured to be electrically connected in series in order to complete an electrical circuit between the first electrode and the second electrode. In that manner, at least a portion of the variation of the resistance of the variable optical attenuator with temperature is thermally compensated when the voltage source is energized.

In summary, the microelectromechanical motion structure of the present disclosure generates a controlled transversal motion in response to a small deformation in an axis direction of a motion actuator comprising an electrothermal material. Axis motion of one beam causes a differential axis motion of two parallel neighboring beams. Those two beams, on one end, are connected with a motion shutter. The other end of one beam is connected to a V-beam thermal actuator, while the other beam is fixed at the substrate.

FIG. 4 illustrates an optical signal control device 400 including a MEMS displacement amplification structure, in accordance with various embodiments of the present disclosure. The device 400 can include a MEMS displacement structure 410 as described above with reference to FIGS. 1 and 2. The device 400 can allow convenient integration of a MEMS displacement amplification structure into an existing circuit or optical system. In some embodiments, the dimensions of the device 400 can be 3.4×2.5×0.9 mm or smaller (preferably a volume of less than 100 mm$^3$).

The MEMS structure 410 can be mounted to a mounting plate 450. In accordance with various embodiments, the mounting plate 450 can be made of silicon, ceramic, plastics, metals, any combination thereof, or any other suitable material as needed to meet application-specific requirements. The method of mounting the MEMS structure 410 to the mounting plate 450 can include adhesives, bonding, fusing, or any other temporary or permanent attachment methods known in the art. The mounting plate 450 is preferably a passive element for positioning the optical aperture into proper alignment. In some embodiments, a part of the surface of the mounting plate 450 can be metallized. In some embodiments, leads 452 can provide an electrically conductive path between an external control signal source and the first and second electrodes of the MEMS structure 410. The leads 452 can also connect the metallized surface of the mounting plate 450 to the electrodes. The form of the leads 452 can include, but is not limited to, L-pins, mounting shorts, or flying wires. Metal pins 455 can be attached to the surface of the mounting plate 450. The metal pins 455 can couple to complementary pin connectors on a circuit or other device or may be soldered directly to create an electrical connection. The metal pins 455 can be in contact with metallization on the surface of the mounting plate 450. The mounting plate can be thermally coupled to the silicon surface of the chip thereby improving thermal conduction from the actuator beams. This more efficient thermal conduction of heat from the thermally actuated beams improves the operational performance of the device particularly at higher rates of movement of the motion shutter that is required for optical communications systems. Where the beam width of the optical signal being controlled with the device is larger, more displacement of the motion shutter (exceeding 500 microns) is required. The present system enables both large displacement and high frequencies of oscillatory motion of the shutter. In some embodiments, the MEMS structure 410 can block, attenuate, or pass light beams with diameters in a range from 0.1 mm to 1 mm, in a range from 0.3 mm to 0.7 mm, or with at least a diameter of 0.5 mm. In accordance with various embodiments, the MEMS structure 410 can attenuate the light beam by between 25 dB and 70 dB. In some embodiments, the MEMS structure 410 can attenuate light having one or more wavelengths in a range from 200 nm to 8000 nm. In some embodiments, the largest dimension of the combined MEMS structure and mounting plate package can be less than 7 mm.

The motion shutter can be switched between two or more positions at frequencies of at least 10 Hz, or preferably greater than 50 Hz and more preferably at greater than 100 Hz. When operating at a higher frequency of operation, the control circuit can operate in response to the measured temperature or the sensed position of the actuator or motion shutter. A measured optical signal, such as a tapped optical signal, can indicate the position of the shutter, for example, and the control circuit can adjust the drive voltage of the MEMS actuator to adjust the rate of movement and/or position of the shutter relative to the beam.

The mounting plate 450 can include an aperture 454 that passes through the plate. In accordance with various embodiments, the aperture 454 is located in line with the motion shutter of the MEMS structure 410 along an axis that can be perpendicular to a planar surface of the MEMS structure 410. In an exemplary embodiment, the device 400 can operate in at least two modes. In a first mode, the motion actuator of the MEMS device is activated or deactivated such that the motion shutter blocks light emitted from a source 470 that passes through the aperture 454. In the first mode, the light does not reach the detector 472. In a second mode, the motion actuator of the MEMS device is activated or deactivated such that the motion shutter allows light emitted from the source 470 that passes through the aperture 454 to pass out of the device 400 and be detected at a detector 472. In some embodiments, the device 400 can operate in a third mode. In the third mode, the motion actuator of the MEMS device is activated or deactivated such that the motion shutter partially blocks light emitted from a source 470 that passes through the aperture 454. In the third mode, the light that is detected at the detector 472 is attenuated. In various embodiments, the aperture 454 can have a diameter of at least 230, 320, 400, 500 or 700 µm. The mounting structure can also be used with the optical switch described in U.S. Pat. No. 8,203,775, the entire contents of which is incorporated herein by reference.

Figure 5:
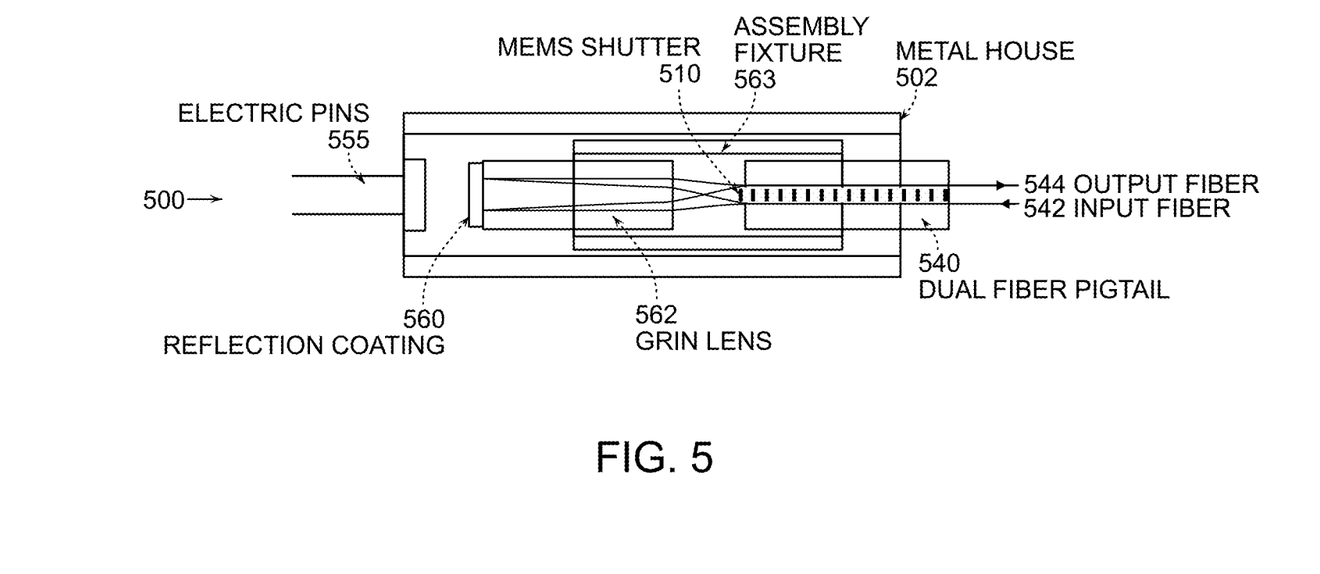
FIG. 5 illustrates an optical path containing a MEMS displacement amplification structure in accordance with various embodiments of the present disclosure

FIG. 5 illustrates the use of a MEMS displacement amplification structure in a variable optical attenuator setup according to various embodiments of the present invention. In the embodiment depicted, the components of the device 500 are housed within a metal housing 502. The housing 502 can be made of a variety of materials including metal and plastics. An input fiber 542 carries light into the metal housing 502 and into an assembly fixture 563. The light continues into the GRIN lens 562 where it is focused. The focused light can be reflected by a reflection coating 560 on the GRIN lens 562. The light may then pass back through the assembly fixture 563 and must pass the MEMS shutter 510.

The MEMS shutter 510 can preferably utilize the MEMS displacement structure 10 described previously with reference to FIGS. 1A and 2A. The MEMS shutter 510 can be fully open, fully closed, or partially open. If the MEMS shutter 510 is partially open (i.e., is only partially blocking the input beam), the beam will be attenuated. After the light passes the MEMS shutter 510, it can proceed into the output fiber 544 and exit the device 500. The MEMS shutter 510 and any other electrically active elements can receive control signals from electric pins 555 that extend from the device 500.

In operation, the analog-motion MEMS shutter 510 is driven by DC voltage to block the output beam path, thereby variably attenuating the optical intensity of the signal coupled into the output fiber. In various embodiments, the attenuation of the light by displacement of the MEMS shutter 510 can be continuously adjusted with the applied current or voltage. Due to its placement in close proximity to the input fiber pigtail where the beam size is small, the required motion of the MEMS shutter can be as small as 15 µm for a single mode fiber without sacrificing the range of attenuation. The unique attributes inherent to electro-thermal actuation allow on-chip passive compensation of temperature related drift and fluctuations over a 75° C. operating temperature range. There is no need for active compensation by circuitry for temperature sensing or compensation by look-up table. Alternatively, additional integrated circuit components can be incorporated into the MEMS silicon substrate to enable control or signal processing functions.

Drive circuitry can be configured to operate the system at high frequencies for optical switching applications. The drive circuitry can utilize temperature compensation utilizing a temperature sensor as previously described herein and can further use optical sensors to monitor the position of the actuator and/or motion shutter to control operation of the drive circuitry.

In summary, the microelectromechanical motion structure of the present disclosure generates a controlled transversal motion in response to a small deformation in an axis direction of a motion actuator comprising an electrothermal material. Axis motion of one beam causes a differential axis motion of two parallel neighboring beams. Those two beams, on one end, are connected with a motion shutter. The other end of one beam is connected to a V-beam thermal actuator, while the other end of the other beam is fixed at the substrate.

Figure 6:
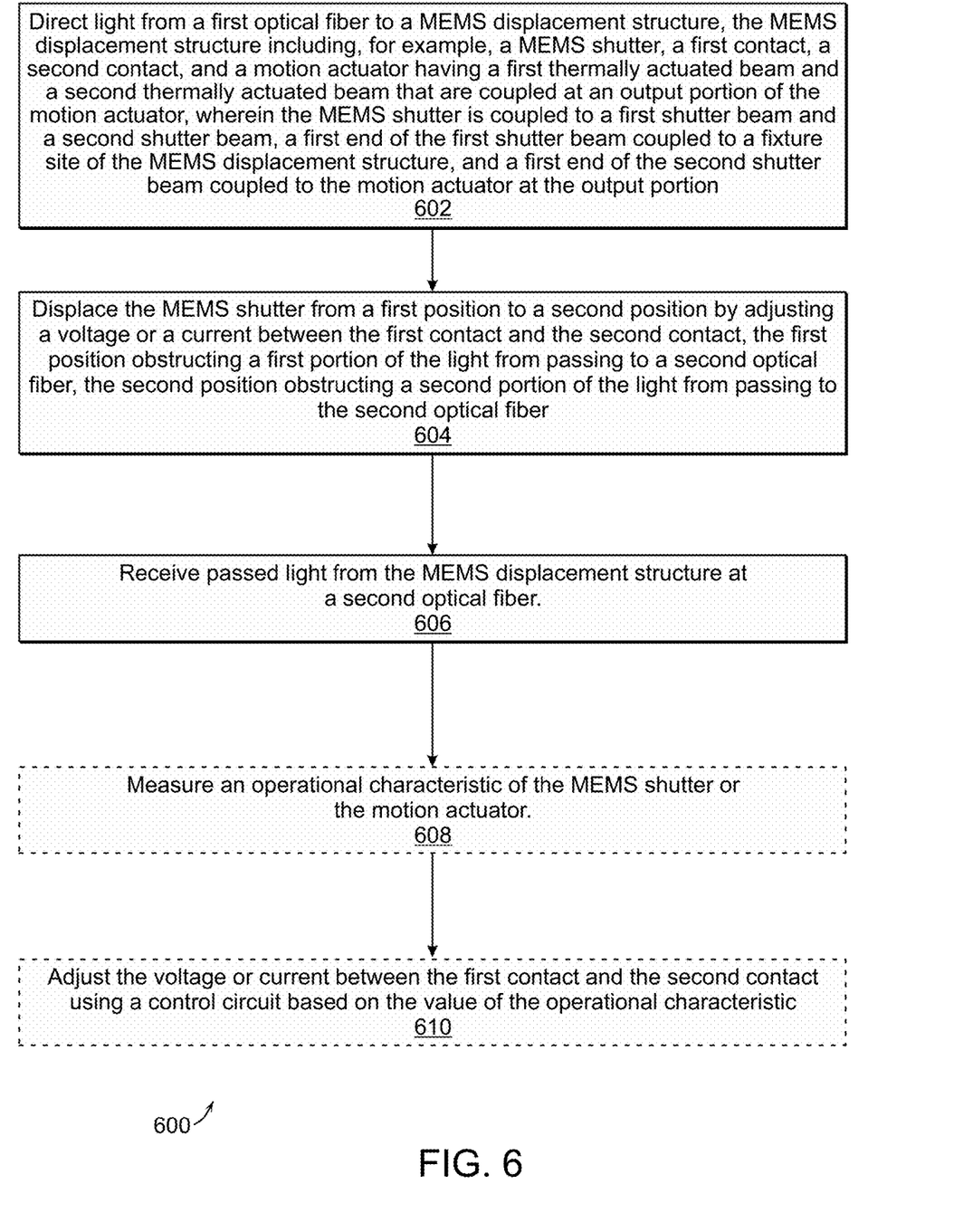
FIG. 6 illustrates a method of using a MEMS structure to operate a VOA or optical switch, for example, according to various embodiment described herein.

FIG. 6 illustrates a method of using a MEMS structure to operate a VOA or optical switch, for example, according to various embodiment described herein. The method 600 can include directing light from a first optical fiber to a MEMS displacement structure (Step 602). For example, the MEMS displacement structure can include a MEMS shutter and first and second contacts. The method can include displacing the MEMS shutter from a first position to a second position by adjusting a voltage or a current between the first contact and the second contact, the first position obstructing a first portion of the light from passing to a second optical fiber, the second position obstructing a second portion of the light from passing to the second optical fiber (Step 604). The method can also include receiving passed light from the MEMS displacement structure at a second optical fiber (Step 606).

In some embodiments of the method, directing light from the first optical fiber to the MEMS displacement structure can include focusing the light onto a reflective surface using an optical focusing element and directing light from the reflective surface to the MEMS displacement structure.

In some embodiments, displacing the MEMS shutter from the first position to the second position can include activating a motion actuator of the MEMS displacement structure, the motion actuator having a first thermally actuated beam and a second thermally actuated beam that are coupled at an output portion of the motion actuator. In some embodiments, activating the motion actuator of the MEMS displacement structure can include passing electrical current through the first thermally actuated beam and the second thermally actuated beam. The MEMS shutter can be coupled to a first shutter beam and a second shutter beam, a first end of the first shutter beam coupled to a fixture site of the MEMS displacement structure, and a first end of the second shutter beam coupled to the motion actuator at the output portion.

Although the present disclosure has been described with respect to various embodiments, it should be understood that these teachings are also capable of a wide variety of further and other embodiments within the spirit and scope of the appended claims.

The invention claimed is:

1. A thermally actuated displacement structure for an optical device, comprising:
   a silicon on insulator (SOI) structure including a silicon layer;
   a motion actuator having a first thermally actuated beam and a second thermally actuated beam that are coupled to a frame having the SOI structure and that are further coupled at an output portion of the motion actuator;
   a motion shutter formed with the silicon layer and coupled to a first shutter beam and a second shutter beam, a first end of the first shutter beam coupled to a site that is coupled to the frame, and a first end of the second shutter beam coupled to the motion actuator at the output portion; and
   wherein, in response to a displacement of the motion actuator along an axis direction of the second shutter beam, the motion shutter displaces along a displacement direction relative to the axis direction to control an optical signal, and
   wherein a second end of the first shutter beam and a second end of the second shutter beam are attached to the motion shutter in a substantially parallel position and are displaced in a transverse direction that is orthogonal to an axis of displacement of the second shutter beam in response to the motion actuator.

2. The structure of claim 1, wherein the displacement of the motion actuator along the axis direction ranges from about 25 to about 50 microns and the motion shutter displaces a distance along the transverse direction of between 500 microns and 1000 microns.

3. The structure of claim 1, wherein the first shutter beam and the second shutter beam have a strip shape and comprise an elastic material.

4. The structure of claim 1, wherein the motion shutter has a shape selected from one of a square, a rectangle, a circle, an oval, and a polygon.

5. The structure of claim 1, wherein the first shutter beam and the second shutter beam are formed with the silicon layer.

6. The structure of claim 1, wherein the silicon layer further comprises a doped silicon layer, the silicon layer overlying an insulating layer of the SOI structure.

7. The structure of claim 1, further comprising a first electrode and a second electrode.

8. The structure of claim 7, further comprising a temperature coefficient component circuit that is electrically connected to the first electrode and the second electrode.

9. The structure of claim 7, wherein application of voltage to the motion actuator through the first and second electrodes causes displacement of the second shutter beam along an axis direction of the second shutter beam.

10. The structure of claim 7, further comprising a power supply to supply voltage to the first electrode and the second electrode to electronically control a position of the motion shutter.

11. The structure of claim 1, wherein the displacement structure comprises an optical attenuator.

12. The structure of claim 11, wherein the motion shutter is an opaque shutter.

13. The structure of claim 11 wherein the motion shutter further comprises a reflective material.

14. The structure of claim 1, wherein the first thermally actuated beam and the second thermally actuated beam of the motion actuator comprise a v-beam structure.

15. The structure of claim 1, wherein the motion shutter is displaced at least 500 microns in response to a small movement of the motion actuator.

16. The structure of claim 1, further comprising a control circuit connected to the motion actuator to control actuation in response to a measured change in a motion actuator operation.

17. The structure of claim 1, wherein the motion shutter is an optical shutter.

18. The structure of claim 1, wherein the frame defines an actuating region and a response region, the motion shutter located in the response region and the motion actuator located in the actuating region.

19. The structure of claim 18, further comprising a first electrode and a second electrode located in the actuating region.

20. The structure of claim 18, further comprising a first electrode and a second electrode positioned on the frame.

21. The structure of claim 1, wherein the motion actuator comprises an electrothermal material.

22. The structure of claim 1, wherein the motion actuator is configured to have an angled shape having a vertex portion and an interior angle ranging from about 120 degrees to about 180 degrees.

23. The structure of claim 22, wherein the first end of the second shutter beam is mechanically coupled to the vertex portion of the motion actuator.

24. The structure of claim 1, further comprising a temperature sensor to measure a change in thermal response of the motion actuator and to enable control of the position of the motion shutter in response to the measured change.

25. The structure of claim 1, further comprising a negative temperature coefficient component electrically connected to the first and second thermally actuated beams.

26. The structure of claim 1 wherein the site that is coupled to the frame comprises a fixture site in the silicon layer.

27. The structure of claim 26 wherein the fixture site is immobilized.

28. The structure of claim 1 wherein the first shutter beam and the second shutter beam are in a plane and have a differential displacement from a parallel position.

29. The structure of claim 1 further comprising a plurality of V-beam actuators.

30. The structure of claim 1 wherein the motion shutter undergoes displacement direction motion in the transverse direction.

31. The structure of claim 1 wherein a small movement of the motion actuator causes a larger movement of the motion shutter.

32. A thermally actuated displacement structure for an optical device, comprising:
- a frame having silicon on insulator (SOI) structure including a silicon layer;
- a motion actuator having a v-beam structure including a first thermally actuated beam and a second thermally actuated beam that are coupled to the frame having the SOI structure and that are further coupled at an output portion of the motion actuator;
- a motion shutter formed with the silicon layer and coupled to a first shutter beam and a second shutter beam, a first end of the first shutter beam coupled to a site that is coupled to the frame, and a first end of the second shutter beam coupled to the motion actuator at the output portion; and
- wherein, in response to a displacement of the motion actuator along an axis direction of the second shutter beam, the first shutter beam and the second shutter beam undergo a relative differential displacement such that the motion shutter displaces along a displacement direction relative to the axis direction to control an optical signal.

33. The structure of claim 32, wherein the first shutter beam and the second shutter beam have a strip shape and comprise an elastic material.

34. The structure of claim 32, wherein the motion shutter has a shape selected from one of a square, a rectangle, a circle, an oval, and a polygon.

35. The structure of claim 32, wherein the first shutter beam and the second shutter beam are formed with the silicon layer.

36. The structure of claim 32, wherein the silicon layer further comprises a doped silicon layer, the silicon layer overlying an insulating layer of the SOI structure.

37. The structure of claim 32, further comprising a first electrode and a second electrode.

38. The structure of claim 32, wherein the displacement structure comprises an optical attenuator.

39. The structure of claim 32, wherein the motion shutter is an opaque shutter.

40. The structure of claim 32, wherein the motion shutter is displaced at least 500 microns in response to a small movement of the motion actuator.

41. The structure of claim 32, further comprising a control circuit connected to the motion actuator to control actuation in response to a measured change in a motion actuator operation.

42. The structure of claim 32, wherein the motion shutter is an optical shutter.

43. The structure of claim 32, wherein the frame defines an actuating region and a response region, the motion shutter located in the response region and the motion actuator located in the actuating region.

* * * * *